United States Patent [19]
Myers

[11] Patent Number: 5,240,429
[45] Date of Patent: Aug. 31, 1993

[54] CHIP CARRIER SOCKET

[75] Inventor: Bruce B. Myers, South Bend, Ind.

[73] Assignee: Wells Electronics, Inc., South Bend, Ind.

[21] Appl. No.: 847,359

[22] Filed: Mar. 6, 1992

[51] Int. Cl.$^5$ .............................................. H01R 13/15
[52] U.S. Cl. ..................................... 439/259; 439/264
[58] Field of Search .............. 439/264, 266, 269, 267, 439/68, 70, 71, 73, 330, 331, 259

[56] References Cited

U.S. PATENT DOCUMENTS

| | | | |
|---|---|---|---|
| 4,691,975 | 9/1987 | Fukunaga et al. | 439/266 |
| 4,715,823 | 12/1987 | Ezura et al. | 439/267 |
| 4,801,273 | 1/1989 | Ikeya et al. | 439/264 |
| 4,846,704 | 7/1989 | Ikeya | 439/331 |
| 4,886,470 | 12/1989 | Billman et al. | 439/266 |
| 5,108,302 | 4/1992 | Pfaff | 439/266 |

Primary Examiner—Larry I. Schwartz
Assistant Examiner—Hien D. Vu
Attorney, Agent, or Firm—Thomas J. Dodd; James D. Hall

[57] ABSTRACT

A socket for carrying an integrated circuit (IC) chip. The socket includes a plurality of opposed contacts which have upper and lower integral beams. The socket also includes a spring-biased movable top with inclined inner side walls to urge the contacts into a latched position with the upper beam contacting a lead or a pod on the IC to establish electrical contact. As the top is pushed down, the resilient nature of the contacts allows the lower beam to ride up the inclined side wall into an unlatched position wherein the IC may be removed from the socket.

8 Claims, 2 Drawing Sheets

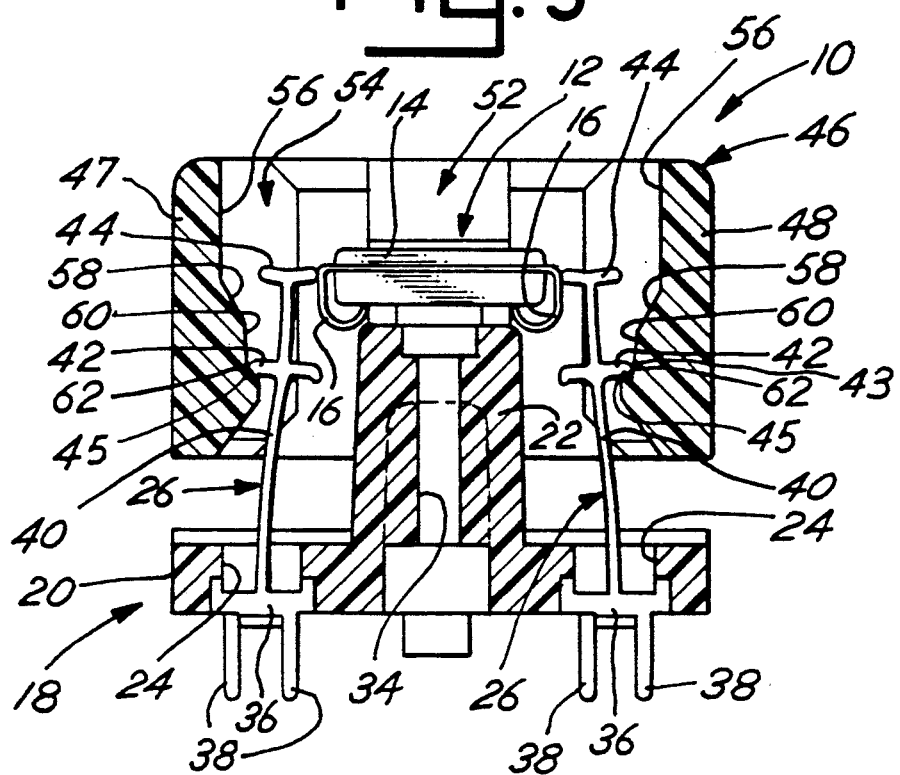
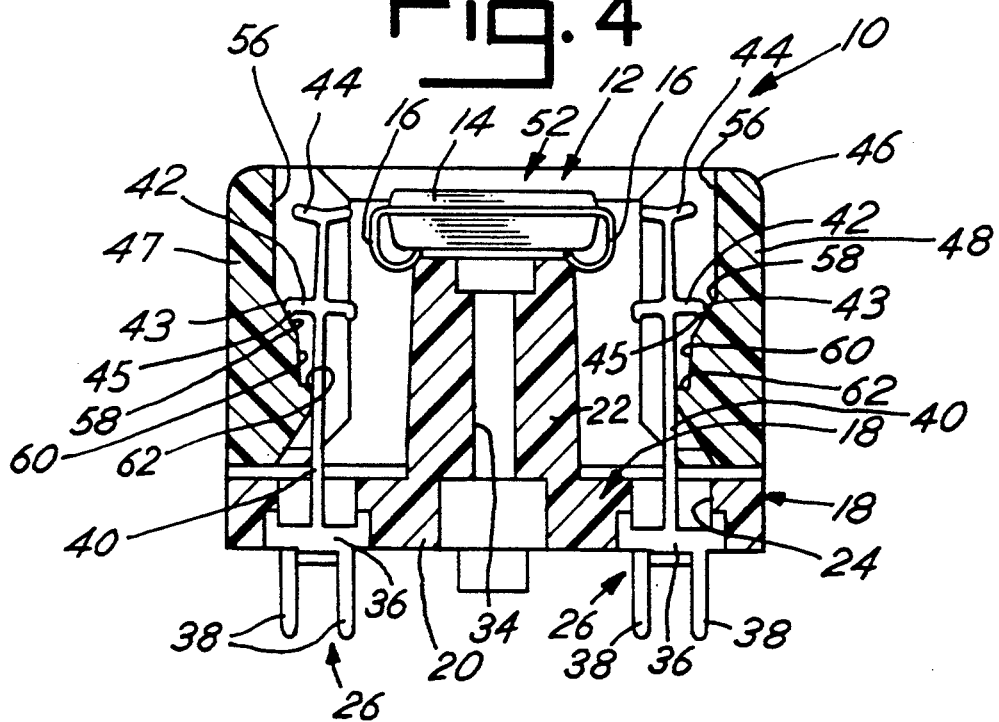

CHIP CARRIER SOCKET

FIELD OF THE INVENTION

This invention relates to sockets for carrying and supporting an integrated circuit chip.

BACKGROUND OF THE INVENTION

As is well known in the art, integrated circuit (IC) chips are often subjected to rigorous testing to ensure their stability and usefulness. A number of sockets have been developed as carriers for the IC chips during testing procedures. Some of these prior sockets are shown in U.S. Pat. Nos. 4,491,877; 4,628,208; and 4,715,823, and in my U.S. patent application Ser. No. 667,470, filed Mar. 11, 1991.

The sockets described in each of the above documents all utilize flexible contacts which are shifted from a normally latched position into an unlatched position by movement of a spring biased top. In U.S. Pat. No. 4,491,377 the angled upper edge of the top cams against inner upper edges of the contacts to spread the contacts and allow for zero insertion force (ZIF) insertion and removal of the chip.

In U.S. Pat. Nos. 4,628,208 and 4,715,823, the flexible contacts include outer cantilevered ledges which are depressed by movement of the top to create a bending moment in the contact neck. This urges the contacts away from the chip to provide for the desired ZIF removal and insertion.

In my U.S. patent application Ser. No. 667,470, the top has angled abutment parts which contact the cantilevered ledges to evenly distribute and lessen the force required to spread the contacts. The ledges are also specially formed to facilitate the spreading function.

In all of the prior art devices described above, the contacts were positioned in the base so that when they were in their normal orientation, that is, unflexed, the contacts pressed against the chip leads (or the chip pods in the event a "leadless" chip was inserted) to both secure the chip in the socket and to provide electrical continuity during testing and burn-in procedures.

SUMMARY OF THE INVENTION

The socket of this invention includes a plurality of contacts which, when in an unflexed orientation, are spaced from the leads of the chip to provide for ZIF. The contacts are in this unflexed orientation only when the biased top is depressed downwardly toward the base.

Each contact of this socket includes one or more transverse cantilevered beams, at least one of which contacts an angled inner side wall of the top. When the top is released, the biasing members urge the top away from the base. As the top so moves, the beam in contact with the inner side wall rides against the angled side wall in a cantilevered fashion to flex the contacts towards the chip leads until contact with the leads is achieved. The angled side wall may define two angles, first, a relatively steep angle to provide shallower angle to provide the mating force necessary to secure the chip in the socket.

Accordingly, it is an object of this invention to provide for a novel and improved chip carrier socket.

Another object is to provide for a ZIF chip carrier socket which provides for lesser forces necessary to spread the contacts to permit chip insertion and removal.

Another object is to provide for a ZIF chip carrier socket which provides for graded force application to the contacts during the clamping phase of socket operation.

Other objects will become apparent upon a reading of the following description.

BRIEF DESCRIPTION OF THE DRAWINGS

A preferred embodiment of the invention has been depicted for illustrative purposes only wherein:

FIG. 3 is a sectional view taken along line 3—3 of FIG. 1.

FIG. 4 is a sectional view similar to FIG. 3 but showing the contacts in an unlatched position.

DESCRIPTION OF THE PREFERRED EMBODIMENT

Figure 1:
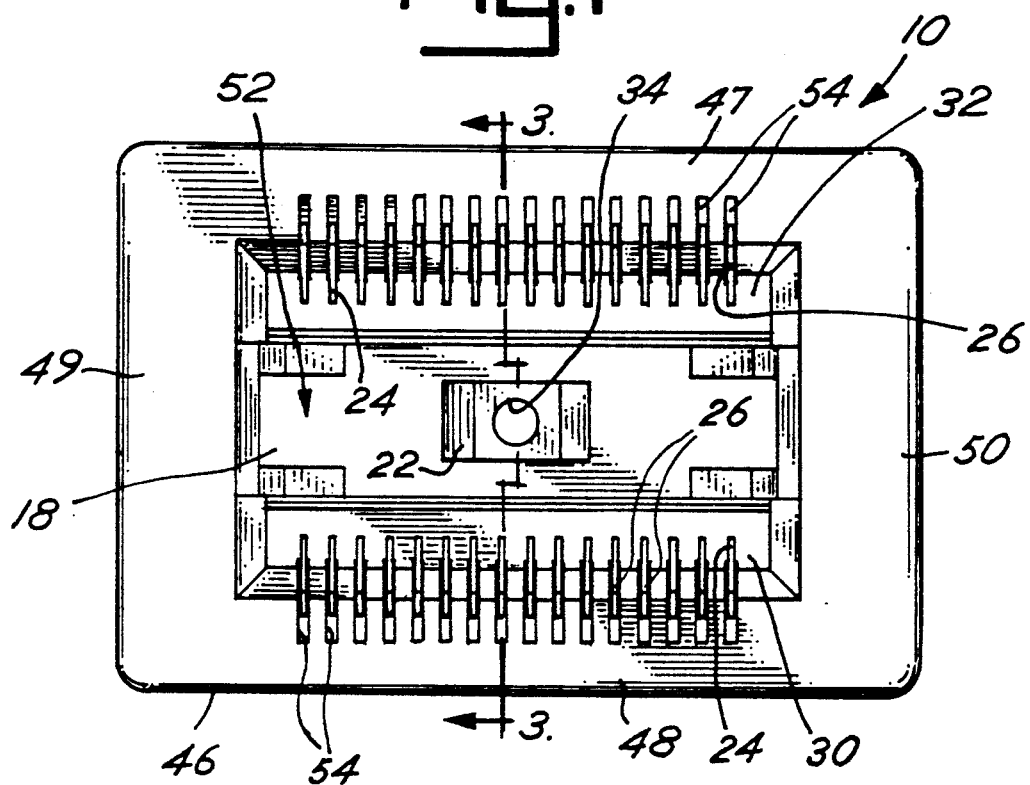
FIG. 1 is a top plan view of the socket of this invention.

The preferred embodiment herein described is not intended to be exhaustive or to limit the invention to the precise form disclosed. It is chosen and described to illustrate the principles of the invention and its application and practical use to allow others skilled in the art to follow its teachings.

Referring now to the drawings, reference numeral 10 generally depicts the socket of this invention. Socket 10 is generally used during burn-in and testing of IC chip 12, which is shown as an SOJ-type device with a body 14 and peripheral leads 16. Socket 10 can also be adapted for use with other types of IC chips, both leaded and leadless.

Socket 10 preferably includes a one-piece base 18 which has a lower base part 20 and an upstanding central table 22. Lower base part 20 has a plurality of grooves 24 defined therein which accommodate contacts 26. Groove 24 are in communication with bores (not shown) in base part 20 which define the "footprint" of socket 10. In the embodiment shown, grooves 24 are positioned along opposite adjacent sides 30, 32 of base part 20, but other configurations are possible dependent upon the IC configuration.

Figure 2:
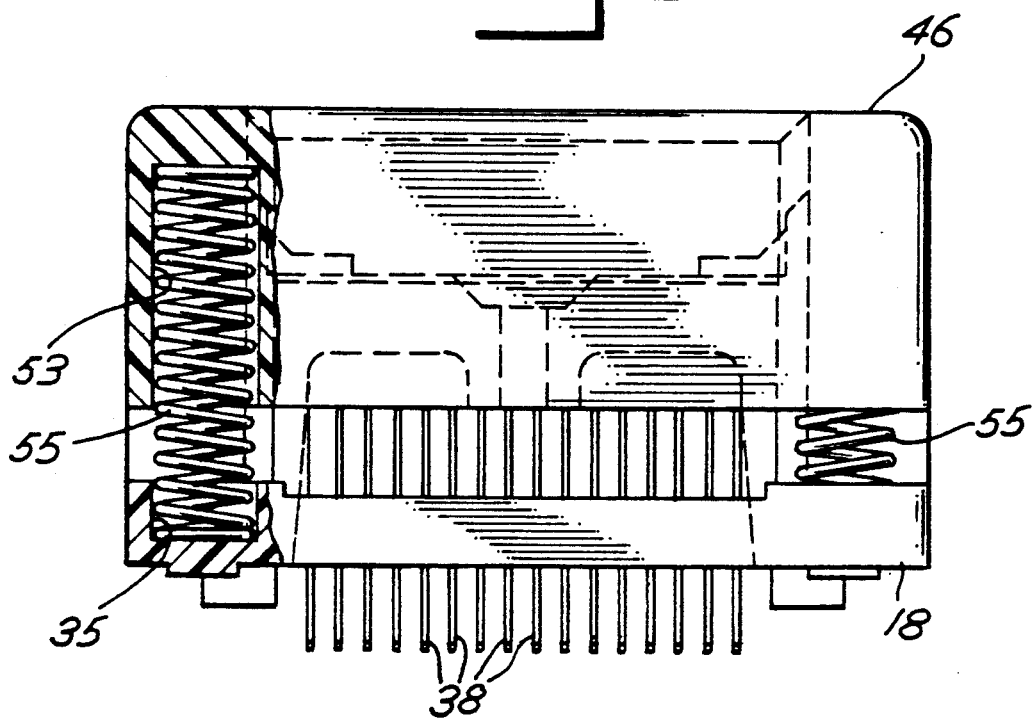
FIG. 2 is a sectional view of the socket taken along line 2—2 of FIG. 1.

Table 22 serves to support the IC chip 12 during burn-in or testing. Table 22 has a central bore 34 which acts primarily as a heat sink during burn-in procedures. Base 18 is preferably formed of molded non-conductive plastic, such as polyphenylene sulfide or the like. Base part 20 also includes corner located pilot bores 35 as seen in FIG. 2.

Each contact 26 is formed of resilient electrically conductive material, such as beryllium/copper alloy, or the like. As shown, each contact 26 is of one piece construction defined by a lower base portion 36 which includes feet 38, an upstanding elongated stem 40 and one or more beams (two shown 42, 44). Each contact 26 is fixedly connected to base part 20 as shown by snugly fitting contact base 36 into grooves 24 with the contact feet 38 extending downwardly of the base 18 usually through holes (not shown) in the base. In their normally unlatched position (FIG. 4) contacts 26 assume a generally vertical orientation which resembles a telephone or telegraph pole.

Socket 10 also includes a top 46, which may also be referred to as an actuator. Top 46 as shown in FIG. 1 is preferably of conformable configuration to base 18, in this case rectangular, and is defined by peripheral side walls 47, 48 and end walls 49, 50 which define a central opening 52. In the embodiment shown, side walls 47, 48 have grooves 54 which are aligned with grooves 24 of base part 20. Central opening 52 allows for access to table 22 to allow for the insertion and removal of chip 12.

Top 46 also has corner located recesses 53 which are aligned with base pilot bores 35. A biasing member shown as helical spring 55 is positioned in bores 35 and recesses 58 and serves to urge the top 46 away from base 18.

As shown in FIGS. 3 and 4, each groove 54 of top 46 is configured along an inner side edge 56 to apply force to contacts 26 and urge the contacts from an unlatched position (FIG. 4) to a latched position (FIG. 8). The preferred configuration shown in the drawings is defined by upper ledge portion 58, lower ledge portion 60 and a lowermost shoulder 62. Preferably, the angle formed between upper ledge portion 58 and side edge 56 is of lesser degree than the angle formed between lower ledge portion 60 and side edge 56. The angle between lowermost shoulder 62 and side edge 56 is substantially perpendicular and allows an outermost portion of beam 42 to effectively halt upward movement of top 46 under the influence of springs 55.

FIGS. 3 and 4 illustrate the operation of socket 10. As shown in FIG. 4, with top 46 depressed, the contacts are in their vertical orientation, referred to also as the unlatched position. The outermost edge 48 of beam 42 is an abutment with side edge 56 of the top 46. With the top 46 and contacts 26 in this position, IC chip 12 may be loaded into the socket 10 by hand or by mechanical device for burn-in.

Chip 12 is loaded through top central opening 52 and rests on table 22 with its leads 16 aligned with contacts 26. Since the size of opening 52 is generally engineered to closely match the size of chip 12, alignment is automatic. Top 46 is then released. The compression of springs 55 then urges top 46 away from base 18. As the top 46 moves away from base 18 beam 42 is cammed inwardly towards opening 52 by the outermost edge 43 riding against ledges 58, 60. The relative angles of ledges 58, 60 allow for lesser force application at first (while the beams 42 ride along ledges 58) to cause contact stem 40 to bend inwardly, then (as the beams ride along ledges 60) for greater force application necessary to clamp IC chip 12 in place. In the embodiment shown, the inward bending of contact stem 40 causes beam 44 to first contact lead 16 of IC chip 12, then to clamp the IC chip in position as the oppositely positioned contacts are urged further inward. When the lowermost edge of contact beam 42 (shown formed with a lower lip 45) contacts lowermost shoulder 62, upward movement of top 46 is halted and the socket 10 and IC 12 are ready for burn in.

After completion of the burn-in or other test procedure, top 46 is depressed, either manually or by mechanical device, toward base 18. The resilient nature of contacts 26 causes the outward flexibility of the contacts, as the beam 42 remains in abutment with ledges 58, 60 until the fully unlatched position of FIG. 3 is reached. IC chip 12 is then removed and another chip may be loaded per the above procedure.

It should be noted that any number of configurations is possible for socket 10 and the arrangement of contacts 26. These individually engineered sockets will depend upon the size and configuration of IC chip 12, and the number and type of leads 16, which in the case of a leadless chip are referred to colloquially as pods.

Other individual engineering details may be necessary, depending again upon the type of chip or leads and these details are contemplated as part of this invention. The details above given are for illustrative purposes only and the scope of this invention is not to be limited to those details. The scope of this invention may be defined instead by reference to the following claims.

What is claimed is:

1. In a socket for carrying an integrated circuit chip, said socket including a base member having an integral table means for supporting said chip, a plurality of resilient electrically conductive contact means anchored in said base member, said contact means constituting means for engaging leads connected to said chip to secure the chip within said socket, said contact means positioned along two opposite sides of said base member, and a top means for urging said contact means between a flexed latched position engaging said chip leads, and an unlatched position spaced from said chip wherein the chip may be removed from the socket, the improvement wherein said top means includes peripheral sidewalls defining a central opening therethrough for inserting said chip therein, each contact means including an elongated longitudinal stem extending upwardly from said base member into said central opening, each contact means including an upper transverse beam part having an outer edge in abutment with an upwardly tapered portion of one of said peripheral side walls of said top, biasing means operatively associated with said base member and top means for normally urging the top means away from said base member wherein each contact means is urged into said latched position, said beam part having an inner edge positioned adjacent to said table and contacting a lead of said chip when the contact means are in the latched position.

2. The socket of claim 1 wherein said peripheral side walls define an inset lower shoulder part, said beam part outer edge contacting said shoulder part when the contacts are in the latched position to halt upward movement of the top means.

3. The socket of claim 1 wherein said peripheral side walls define a downwardly tapered surface having an inwardly angled upper ledge defining a first angle with said side wall, and a lower ledge defining a second angle with respect to the side wall of a greater degree than said first angle.

4. A socket for carrying and supporting an integrated circuit chip, said socket comprising:
 a) a base member including central upper table means for supporting said chip;
 b) a plurality of electrically conductive contacts anchored to said base member, each contact including an elongated longitudinal stem and an upper beam extending transversely of said stem;
 c) a top having a continuous peripheral side wall defining a central opening for inserting said chip therein, said table means positioned in said central opening;
 d) said peripheral side wall having a downwardly tapered portion, said upper beam having an outer edge abutting against said downwardly tapered portion wherein upward movement of said top relative to said base flexes said contacts into a latched position with said contacts contacting leads of said chip, and downward movement of said top allows said contacts to flex into an unlatched position with the contacts spaced from said leads; and e) biasing means operatively associated with said top and base member for urging said top upwardly away from said base member wherein the contacts are normally in said latched position.

5. The socket of claim 4 wherein each contact includes an uppermost second beam extending transversely of said stem, said uppermost beam spaced upwardly from said upper beam and having an inward edge contacting said chip lead when the contacts are in their said latched position.

6. The socket of claim 5 wherein said peripheral side wall includes an inset lower shoulder part, said upper beam having a first edge contacting said shoulder part when the contacts are in said latched position to halt upward movement of the top.

7. The socket of claim 5 wherein said uppermost beam has an outward edge spaced from said inner side wall.

8. In a socket for carrying an integrated circuit chip, said socket including a base member having an integral table means for supporting said chip, a plurality of resilient electrically conductive contact means anchored in said base member, said contact means constituting means for engaging leads connected to said chip to secure the chip within said socket, said contact means positioned along two opposite sides of said base member, and a top means for urging said contact means between a flexed latched position engaging said chip leads, and an unlatched position spaced from said chip wherein the chip may be removed from the socket, the improvement wherein said top means includes peripheral side walls defining a central opening therethrough for inserting said chip therein, each contact means including an elongated stem extending upwardly from said base member into said central opening, each contact means including an upper beam part having a first edge in abutment with an upwardly tapered portion of one of said peripheral side walls of said top, biasing means operatively associated with said base member and top means for normally holding the top means spaced upwardly from said base member when each contact means is in the latched position, said beam part having a second edge positioned adjacent to said table and contacting a lead of said chip when the contact means are in the latched position, one of said peripheral side walls defining an inset lower shoulder part, said beam part first edge contacting said lower shoulder part when the contacts are in the latched position to halt upward movement of said top means.

* * * * *